United States Patent
Little

(10) Patent No.: US 12,237,600 B2
(45) Date of Patent: Feb. 25, 2025

(54) RECEPTACLE ASSEMBLY WITH AN OPTICAL CONNECTOR HOLDER ATOP A RECEPTACLE CONNECTOR

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventor: Terrance F. Little, Fullerton, CA (US)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 444 days.

(21) Appl. No.: 17/706,799

(22) Filed: Mar. 29, 2022

(65) Prior Publication Data

US 2022/0320773 A1    Oct. 6, 2022

Related U.S. Application Data

(60) Provisional application No. 63/200,845, filed on Mar. 31, 2021.

(51) Int. Cl.
| | |
|---|---|
| H01R 12/71 | (2011.01) |
| H01R 13/518 | (2006.01) |
| H01R 13/629 | (2006.01) |
| H01R 13/639 | (2006.01) |
| H01R 43/20 | (2006.01) |

(52) U.S. Cl.
CPC ......... *H01R 12/716* (2013.01); *H01R 13/518* (2013.01); *H01R 13/629* (2013.01); *H01R 13/639* (2013.01); *H01R 43/205* (2013.01)

(58) Field of Classification Search
CPC .. H01R 12/716; H01R 13/518; H01R 13/629; H01R 13/639; H01R 43/205; H01R 12/712; H01R 12/7011; H01R 13/502; G02B 6/4261; G02B 6/428; G02B 6/4292; G02B 6/36; H05K 1/181; H05K 2201/10189
See application file for complete search history.

(56) References Cited

U.S. PATENT DOCUMENTS

| | | | |
|---|---|---|---|
| 7,967,631 B2 * | 6/2011 | Wang | H01R 13/648 439/541.5 |
| 10,468,823 B2 | 11/2019 | Hsu et al. | |
| 10,651,618 B2 | 5/2020 | Wang | |
| 10,873,160 B2 | 12/2020 | Henry et al. | |
| 2020/0343673 A1 | 10/2020 | Poh et al. | |
| 2021/0028580 A1 * | 1/2021 | Yang | H01R 13/6581 |
| 2021/0050692 A1 | 2/2021 | Yang et al. | |

* cited by examiner

*Primary Examiner* — Briggitte R. Hammond
(74) *Attorney, Agent, or Firm* — Ming Chieh Chang

(57) ABSTRACT

A receptacle assembly includes: a receptacle connector for mounting to a printed circuit board; a holder mounted atop the receptacle connector; and a cage enclosing the receptacle connector and the holder, the cage having a main cage body and a cage top detachably secured to a rear portion of the main cage body.

20 Claims, 10 Drawing Sheets

US 12,237,600 B2

RECEPTACLE ASSEMBLY WITH AN OPTICAL CONNECTOR HOLDER ATOP A RECEPTACLE CONNECTOR

CROSS REFERENCE TO RELATED APPLICATION

This application claims priority to U.S. Application No. 63/200,845, filed Mar. 31, 2021, the content of which is incorporated herein by reference in its entirety.

BACKGROUND OF THE INVENTION

1. Field of the Invention

The present invention relates to a receptacle assembly comprising a receptacle connector, a holder mounted atop the receptacle connector, and a cage enclosing the receptacle connector and the holder.

2. Description of Related Art

U.S. Patent Application Publication No. 20210028580 discloses a connector assembly including a cage. The cage includes a cage body, a back cover, and a grounding member. The cage body has a top wall, a mounting side, and two side walls. The top wall, the mounting side, and the two side walls together define a receiving space having a front opening toward the front and a rear opening where the back cover and the grounding member are assembled. On the other hand, U.S. patent Ser. No. 10/651,618 discloses a receptacle assembly having at least one guide groove extending along a mating direction and a plug assembly having at least one guide block protruding from a main body thereof to correspond to the at least one guide groove in order to prevent improper insertion configuration.

SUMMARY OF THE INVENTION

An object of the present invention is to provide a receptacle assembly that improves high-speed signal transmission.

To achieve the above-mentioned object, a receptacle assembly comprises a receptacle connector for mounting to a printed circuit board; a holder mounted atop the receptacle connector; and a cage enclosing the receptacle connector and the holder, the cage having a main cage body and a cage top detachably secured to a rear portion of the main cage body.

According to the present invention, the receptacle assembly comprises a holder mounted atop the receptacle connector. Therefore, the receptacle assembly can increase the transmitting channel through mounting another connector on the holder.

Other advantages and novel features of the invention will become more apparent from the following detailed description of the present embodiment when taken in conjunction with the accompanying drawings.

DETAILED DESCRIPTION OF THE PREFERRED EMBODIMENT

Reference will now be made in detail to the embodiments of the present disclosure.

Figure 1:
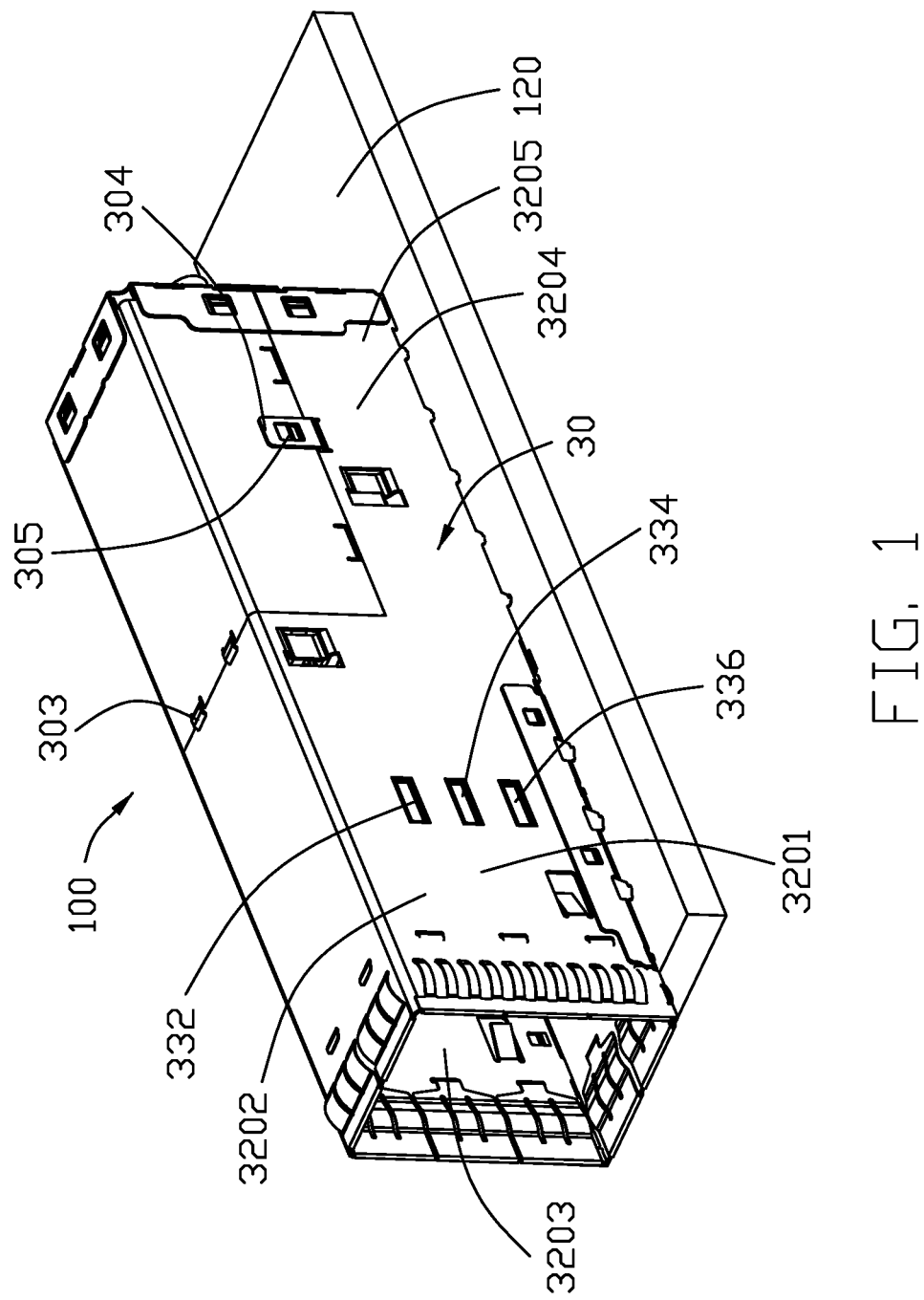
FIG. 1 is a perspective view of a receptacle assembly in accordance with the present invention mounted on a printed circuit board for insertion of a pluggable module.
Figure 2:
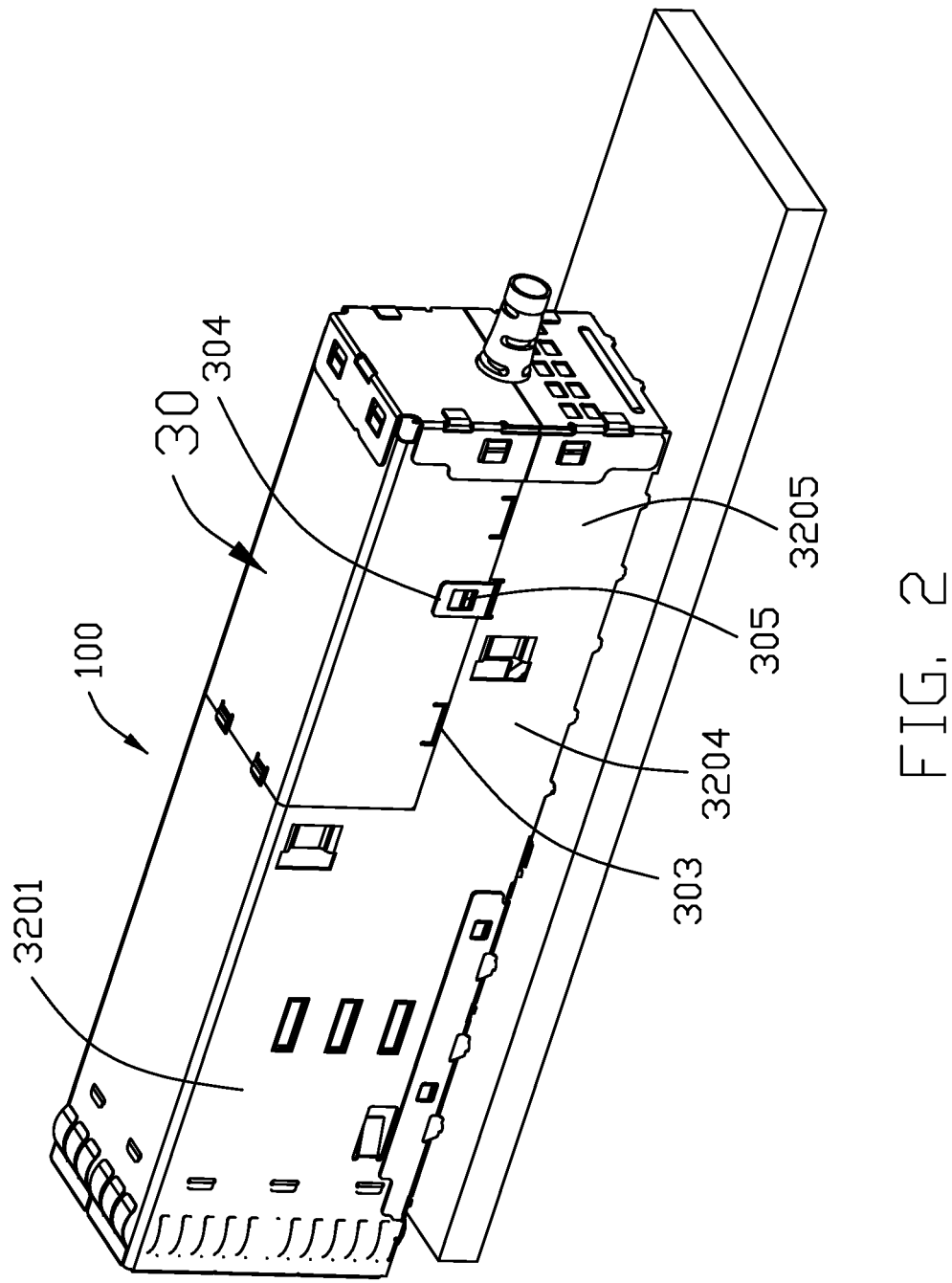
FIG. 2 is a view similar to FIG. 1 but from another perspective.
Figure 3:
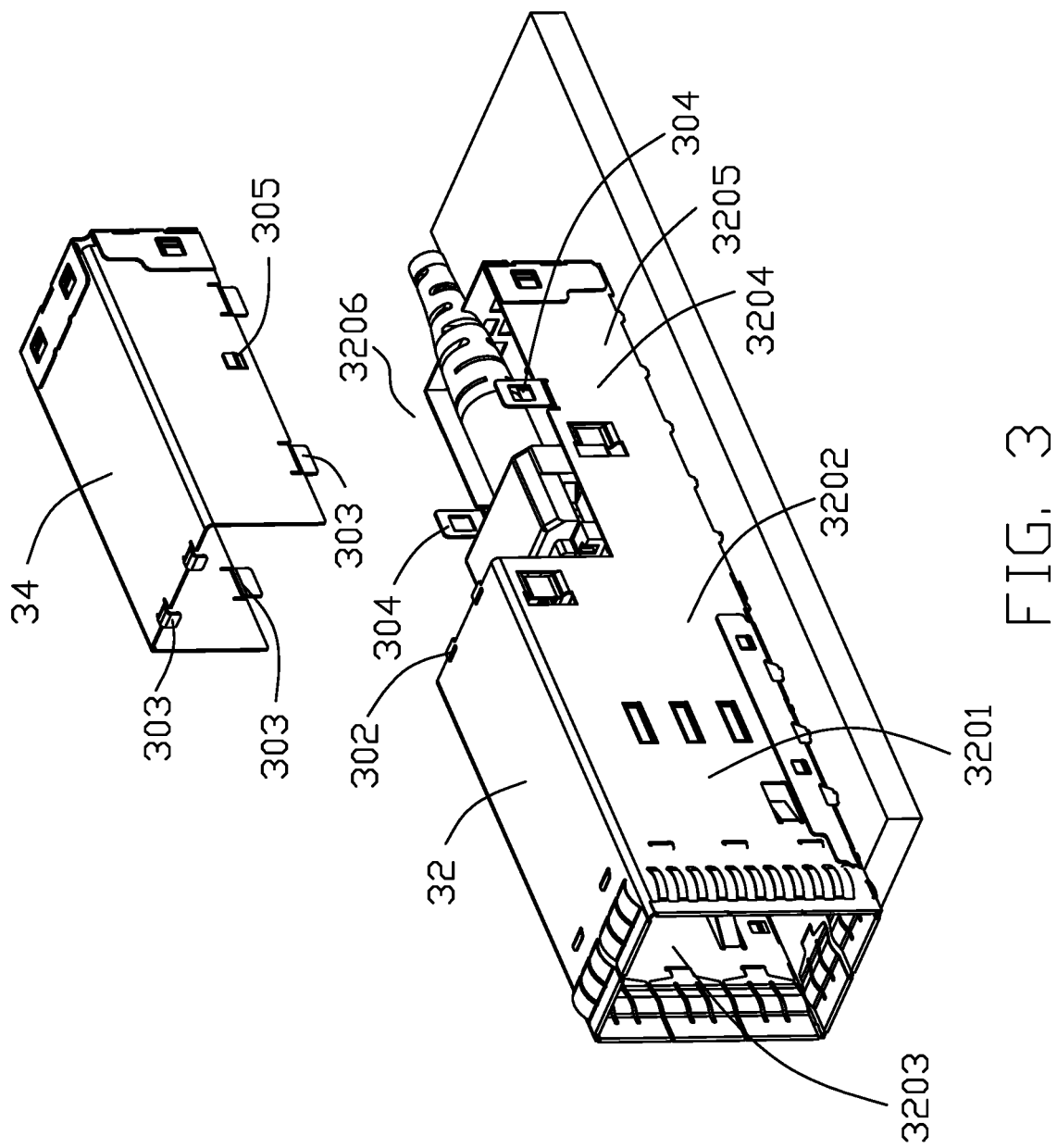
FIG. 3 is an exploded view of a cage of the receptacle assembly in FIG. 1.
Figure 4:
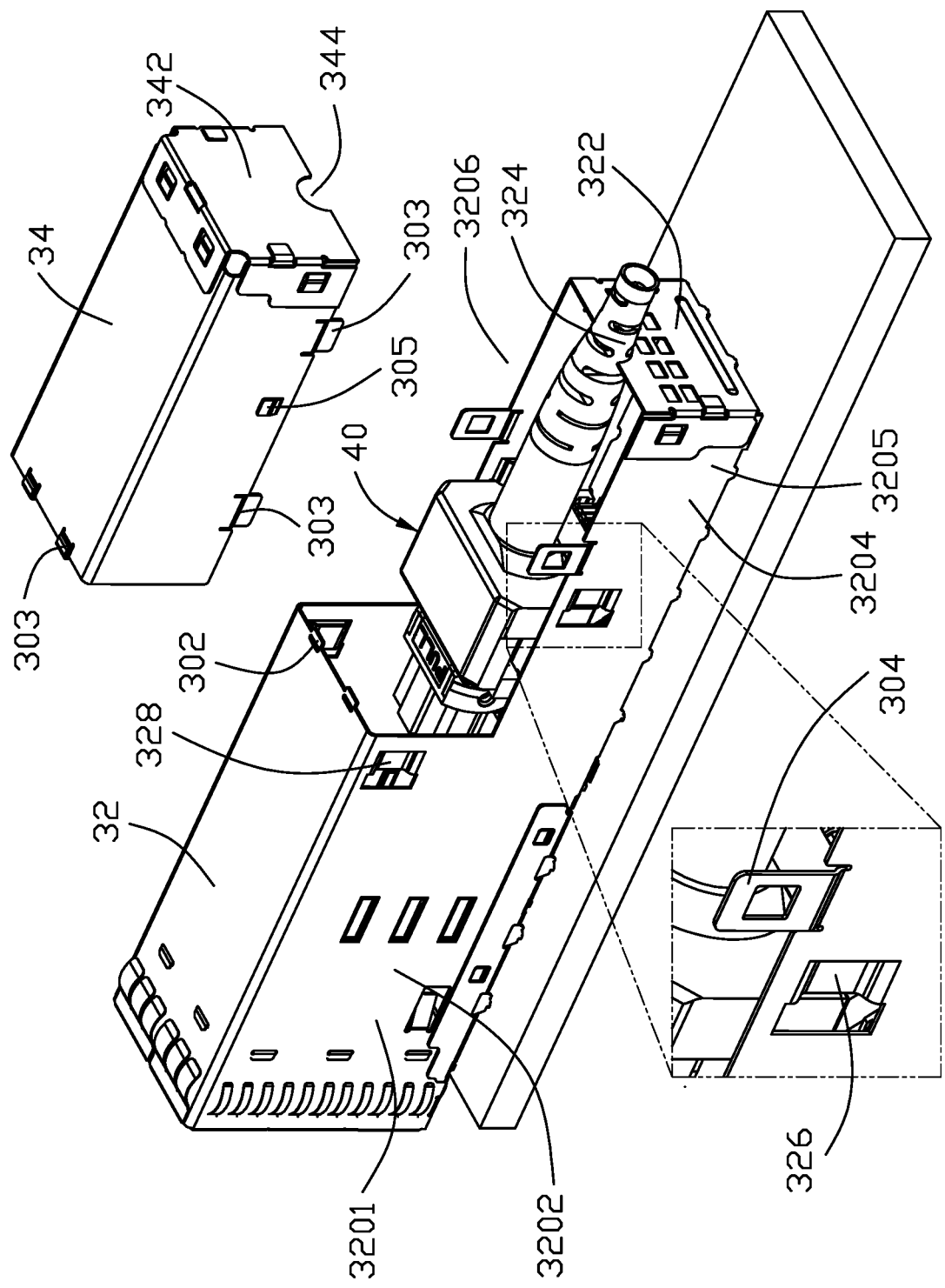
FIG. 4 is a view similar to FIG. 3 but from another perspective.
Figure 5:
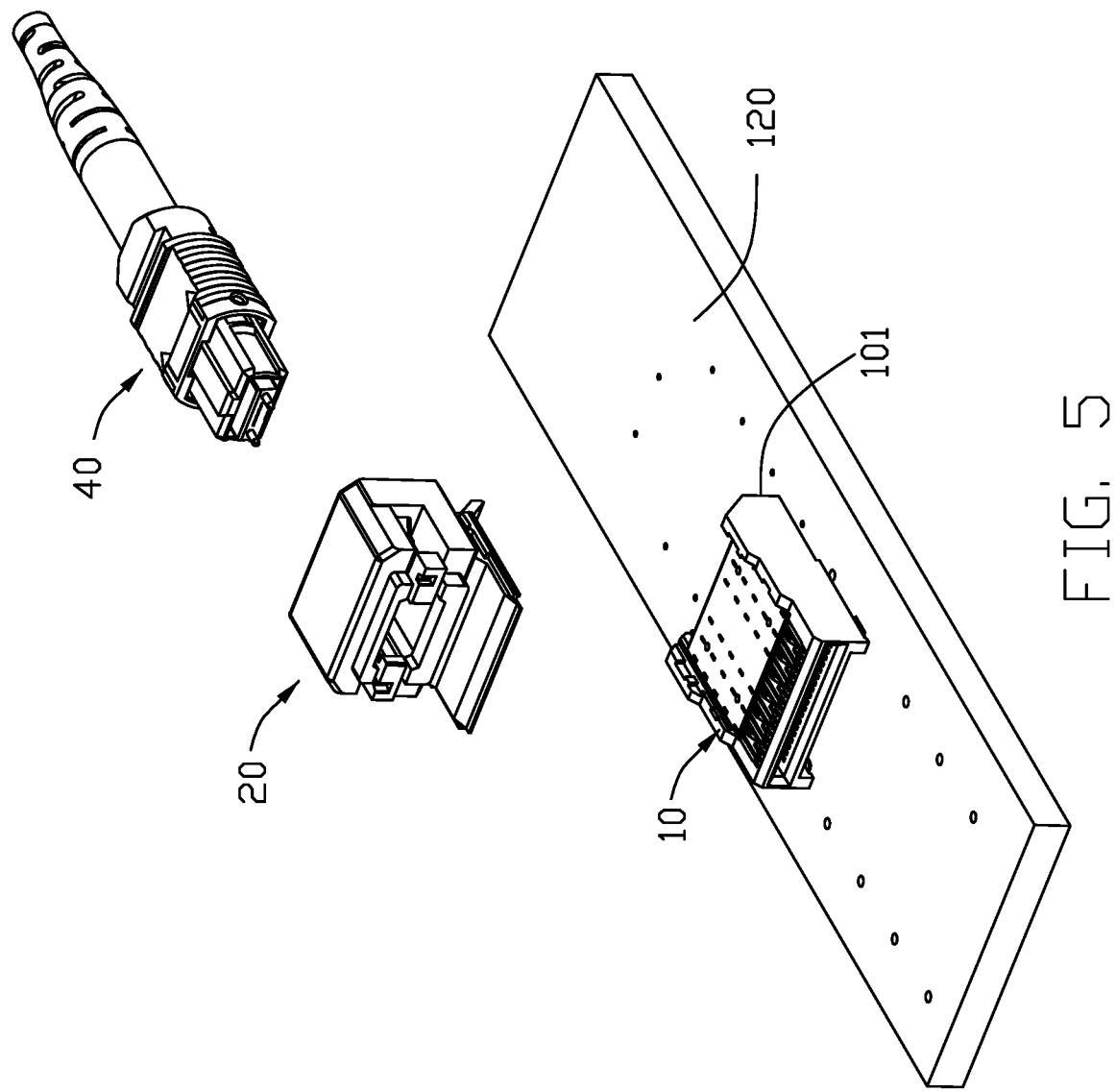
FIG. 5 is an exploded view of a receptacle connector and a holder of the receptacle assembly in FIG. 3.
Figure 6:
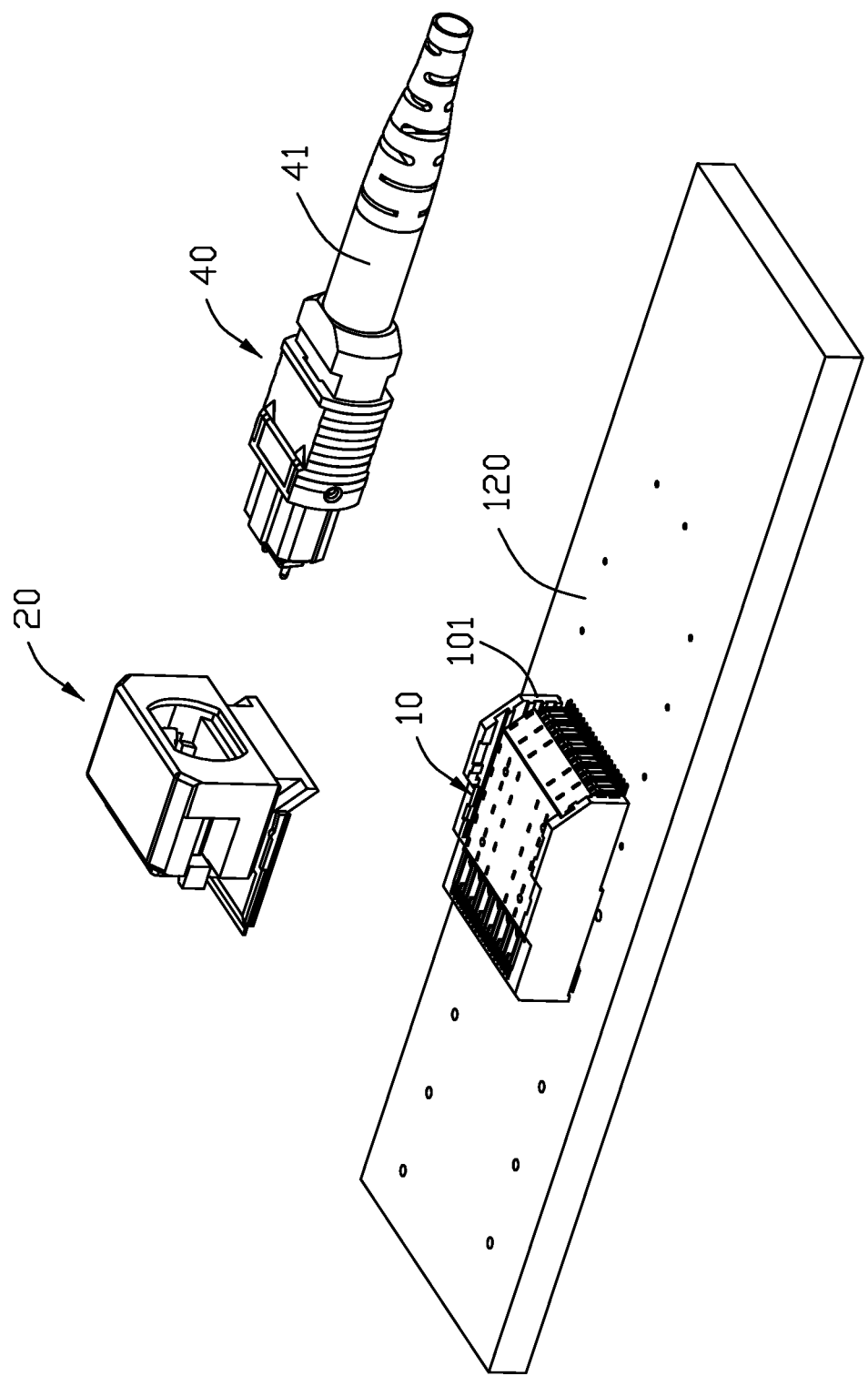
FIG. 6 is a view similar to FIG. 5 but from another perspective.
Figure 7:
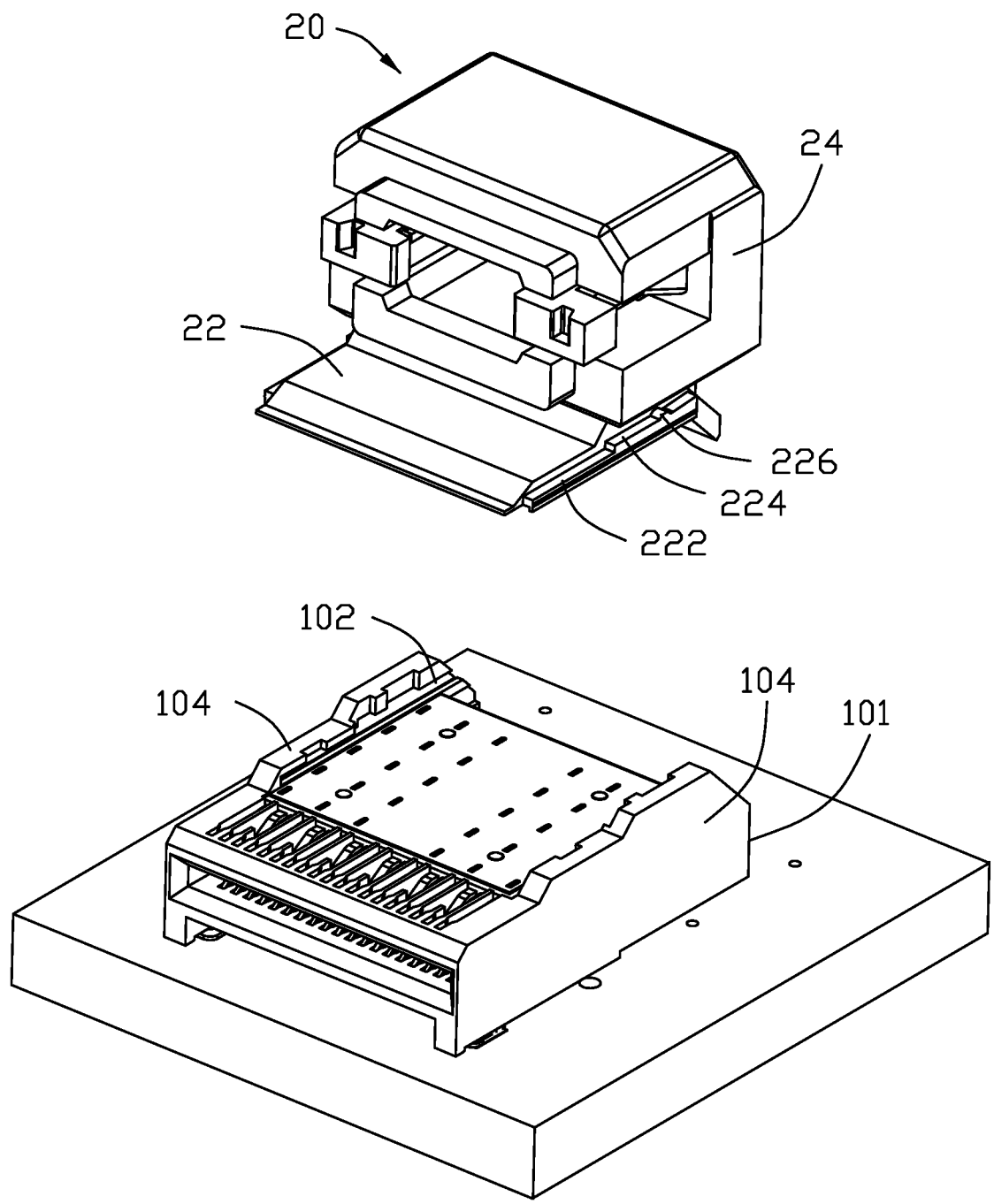
FIG. 7 is an enlarged view of the receptacle connector and the holder.
Figure 8:
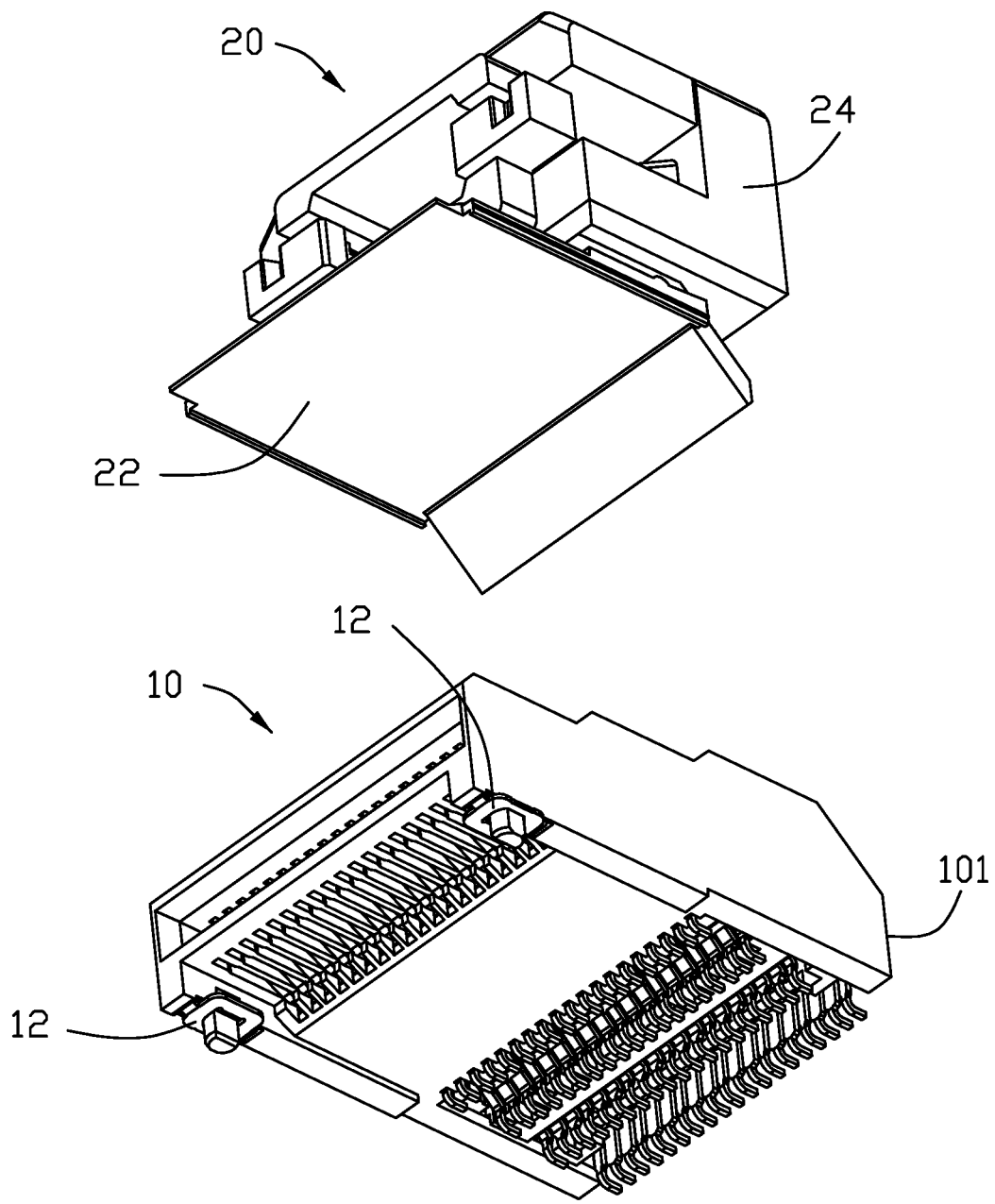
FIG. 8 is a view similar to FIG. 7 but from another perspective.
Figure 9:
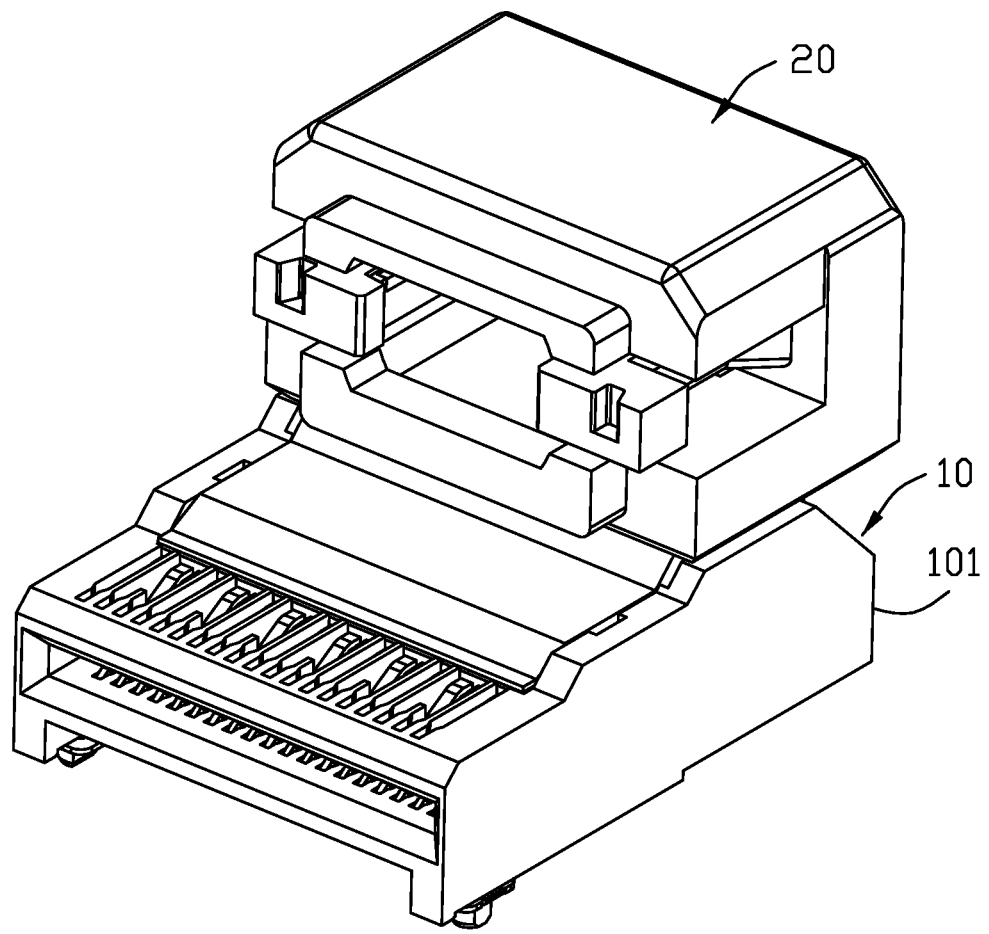
FIG. 9 is an assembled view of the receptacle connector and the holder.
Figure 10:
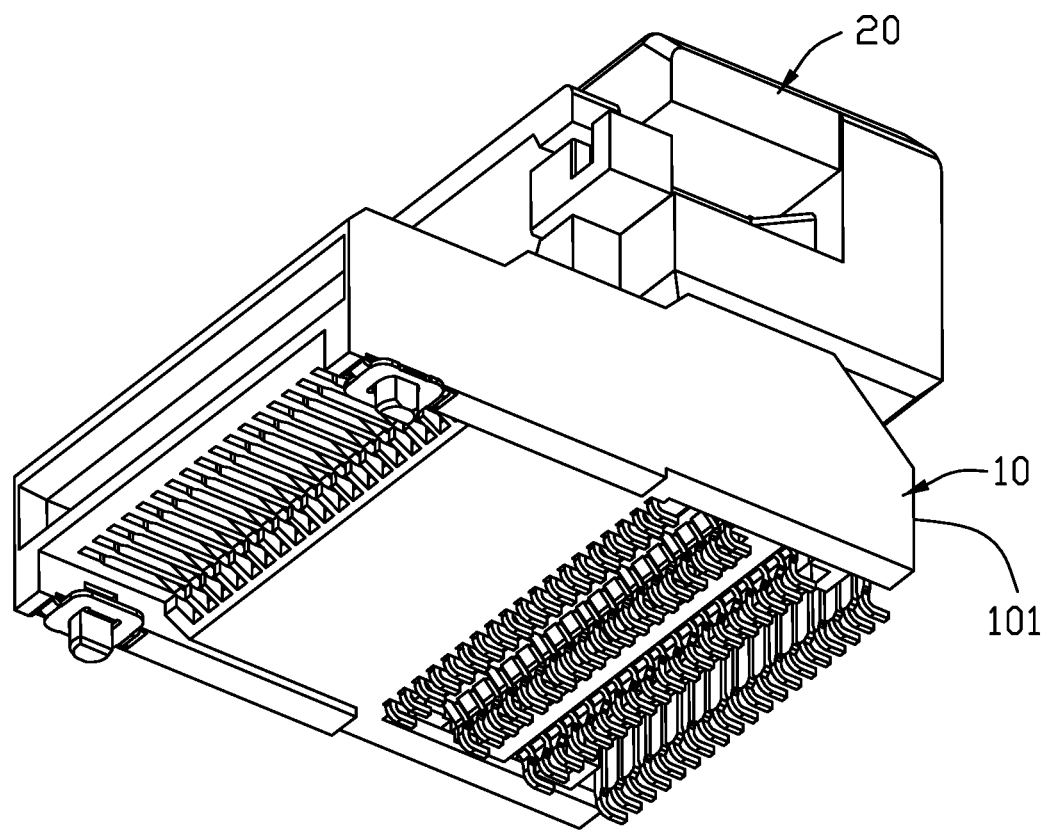
FIG. 10 is a view similar to FIG. 9 but from another perspective.

Referring to FIGS. 1-10, a receptacle assembly 100 comprises a receptacle connector 10 for mounting to a printed circuit board (PCB) 120, a holder 20 mounted atop the receptacle connector 10, and a cage 30 enclosing the receptacle connector 10 and the holder 20. The cage 30 has a main cage body 32 and a cage top 34 detachably secured to a rear portion of the main cage body 32. The receptacle assembly 100 may further comprise an optical connector 40 having an optical cable 41 mounted to the holder 20.

The main cage body 32 has at a rear wall 322 thereof a first notch 324 and the cage top 34 has at a rear wall 342 thereof a second notch 344, and the optical cable 41 of the optical connector 40 passes through the first and second notches 324 and 344 in a conforming manner, i.e., the shapes of the first and second notches 324 and 344 are designed to conform to the shape of the portion of the optical connector 40 thereat in order to minimize electromagnetic interference (EMI). The rear walls 322 and 342 may each be a separately mounted distinct component for EMI consideration. The main cage body 32 defines a pair of positioning holes 302, and the cage top 34 comprises a plurality of positioning tabs 303 for being inserted into the positioning holes 302 and the internal side of the main cage body 32. The main cage body 32 comprises a pair of latched beams 304 extending upwardly, and the cage top 34 comprises a pair of latch tabs 05 latched with the latch beams 304, respectively. The main cage body 32 comprises a front portion 3201 having a plurality of front side walls 3202 cooperated to form a closed perimeter having a front opening 3203 for inserting a pluggable module, and a rear portion 3024 comprising a plurality of rear side walls 3205 and an upper rear opening 3206. The cage top 34 is secured to the rear portion 3204 of the main cage body 32 to close the upper rear opening 3206.

The receptacle connector 10 has a respective groove 102 at each of two side walls 104 thereof. The receptacle connector 10 may include a pair of soldering rings 12 for added retention to the PCB 120. The receptacle connector 10 may have plural contact units and a mating slot for receiving a paddle card and may be constructed in accordance with QSFP (Quad Small Form-factor Pluggable) Double Density specification. For example, any or all of the features described in U.S. Provisional Application No. 63/053,611, filed Jul. 18, 2020, entitled "ELECTRICAL DEVICE" or U.S. Provisional Application No. 63/134,557, filed Jan. 6, 2021, entitled "ELECTRICAL CONNECTOR ASSEM- BLIES" may be used instead of or in addition to the features of connector 10 shown and/or described herein. In other embodiment, the receptacle connector 10 may be constructed in accordance with QSFP, SFP, OSFP, SAS, PCIe, Backplane or other suitable products. The holder 20 has a lower base 22 serving also as a cap for the receptacle connector 10 and an upper holding part 24 for accommodating and retaining the optical connector 40. The base 22 has a pair of side flanges 222 for inserting forwardly into the pair of grooves 102. The flange 222 may have a positioning step 224 and a locking protrusion 226. The receptacle connector 10 has a receptacle connector rear face 101. The rear walls 322 and 342 of the cage 30 are disposed at a rear of and spaced apart from the receptacle connector rear face 101. The electrical receptacle connector 10 comprises an electrical mating face 102, and the optical connector 40 comprises an optical mating face 401 disposed behind the electrical mating face 11.

The main cage body 32 has a stopping portion 326 which engages a rear face of the holding part 24 to limit a rearward movement of the holder 20. The main cage body 32 further has another stopping portion 328 to limit a forward movement of the pluggable module inserted into the cage 30. The pluggable module may have a lower QSFP-DD paddle card for inserting into the mating slot of the receptacle connector 10 and an upper mating part for interfacing with the holder 20 and the optical connector 40. The main cage body 32 further has a respective guiding portion on each of two side walls thereof to engage the pluggable module during inserting into the cage 30. The guiding portion in the embodiment shown includes three protrusions 332, 334, 336 for engaging one or more features provided on the pluggable module. In addition, the three protrusions 332, 334, 336 may be so designed and arranged that a QSFP-DD plug or QSFP-28/56 module alone or a stacked QSFP-DD connector, in contrast to the pluggable module having integral paddle card and mating part as well as matching features, is prevented from entering the cage 30 which otherwise might inadvertently damage the optical connector 40.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A receptacle assembly comprising:
 a receptacle connector for mounting to a printed circuit board;
 a holder mounted atop the receptacle connector; and
 a cage enclosing the receptacle connector and the holder, the cage having a main cage body and a cage top detachably secured to a rear portion of the main cage body; wherein
 the main cage body has a respective guiding portion on each of two side walls thereof to engage a pluggable module inserted into the cage.

2. The receptacle assembly as claimed in claim 1, further comprising an optical connector mounted to the holder.

3. The receptacle assembly as claimed in claim 2, wherein the main cage body has a first notch at a rear wall thereof and the cage top has a second notch at a rear wall thereof, and the optical connector passes through the first and second notches in a conforming manner.

4. The receptacle assembly as claimed in claim 1, wherein the receptacle connector has a pair of grooves and the holder has a pair of flanges inserting forwardly into the pair of grooves.

5. The receptacle assembly as claimed in claim 1, wherein the main cage body has a stopping portion to limit a rearward movement of the holder.

6. The receptacle assembly as claimed in claim 1, wherein the main cage body has a stopping portion to limit a forward movement of a pluggable module inserted into the cage.

7. The receptacle assembly as claimed in claim 1, wherein the guiding portion comprises three protrusions for engaging one or more features provided on the pluggable module.

8. The receptacle assembly as claimed in claim 1, wherein the receptacle connector has a receptacle connector rear face, and the cage has a cage rear face disposed behind and spaced apart from the receptacle connector rear face.

9. The receptacle assembly as claimed in claim 1, wherein the main cage body defines at least one positioning hole, and the cage top comprises a plurality of positioning tabs for being inserted into the at least one positioning hole and the internal side of the main cage body, the main cage body latched with the cage top.

10. A receptacle assembly comprising:
 an electrical receptacle connector for mounting to a printed circuit board, the electrical receptacle connector defining a mating slot for an electrical plug having a printed circuit board to be inserted into;
 a holder mounted atop the receptacle connector; and
 an optical connector mounted to the holder; wherein
 the electrical receptacle connector comprises an electrical mating face, and the optical connector comprises an optical mating face disposed in rear of the electrical mating face.

11. The receptacle assembly as claimed in claim 10, wherein the holder comprises a lower base serving also as a cap for the electrical receptacle connector and an upper holding part for accommodating and retaining the optical connector.

12. The receptacle assembly as claimed in claim 11, wherein the electrical receptacle connector defines at least one groove, and the base of the holder comprises at least one flange for inserting forwardly into the at least one groove.

13. The receptacle assembly as claimed in claim 12, wherein the flange comprises a positioning step and a locking protrusion.

14. A cage adapted for receiving a receptacle connector assembly which includes an electrical receptacle connector and an optical connector having an optical cable and stacked with the electrical receptacle connector, the cage comprising:
 a main cage body comprising a front portion having a plurality of front side walls cooperated to form a closed perimeter having a front opening for a pluggable module to be inserted into and mate with the receptacle connector assembly, and a rear portion comprising a plurality of rear side walls and an upper rear opening; and
 a cage top detachably secured to the rear portion of the main cage body to close the upper rear opening; wherein
 the cage defines a rear opening for the optical cable to extend through; and
 the main cage body defines a first notch, and the cage top defines a second notch cooperated with the first notch to form the rear opening.

15. The cage as claimed in claim 14, wherein the main cage body has a stopping portion to limit a forward movement of a pluggable module inserted into the cage.

16. The cage as claimed in claim 14, wherein the main cage body has a stopping portion to limit a rearward movement of the receptacle connector assembly.

17. The cage as claimed in claim 14, wherein the main cage body has a respective guiding portion to engage a pluggable module inserted into the cage.

18. A receptacle assembly comprising:
   a receptacle connector for mounting to a printed circuit board;
   a holder mounted atop the receptacle connector; and
   a cage enclosing the receptacle connector and the holder, the cage having a main cage body and a cage top detachably secured to a rear portion of the main cage body;
   wherein the main cage body has a stopping portion to limit a rearward movement of the holder.

19. The receptacle assembly as claimed in claim 18, further comprising an optical connector mounted to the holder.

20. The receptacle assembly as claimed in claim 19, wherein the main cage body has a first notch at a rear wall thereof and the cage top has a second notch at a rear wall thereof, and the optical connector passes through the first and second notches in a conforming manner.

* * * * *